(12) United States Patent
Plössl et al.

(10) Patent No.: US 8,102,060 B2
(45) Date of Patent: Jan. 24, 2012

(54) ELECTRICALLY CONDUCTING CONNECTION WITH INSULATING CONNECTION MEDIUM

(75) Inventors: Andreas Plössl, Regensburg (DE); Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 295 days.

(21) Appl. No.: 12/301,566

(22) PCT Filed: May 16, 2007

(86) PCT No.: PCT/DE2007/000897
§ 371 (c)(1),
(2), (4) Date: Jun. 22, 2009

(87) PCT Pub. No.: WO2007/134581
PCT Pub. Date: Nov. 29, 2007

(65) Prior Publication Data
US 2009/0302429 A1 Dec. 10, 2009

(30) Foreign Application Priority Data

May 19, 2006 (DE) .......... 10 2006 023 683
Jun. 22, 2006 (DE) .......... 10 2006 028 692

(51) Int. Cl.
*H01L 23/48* (2006.01)
(52) U.S. Cl. .......... 257/783; 257/E23.141; 257/E21.505
(58) Field of Classification Search .......... 257/783, 257/E23.141, E21.505; 438/118
See application file for complete search history.

(56) References Cited

U.S. PATENT DOCUMENTS

| | | | | |
|---|---|---|---|---|
| 3,666,588 A * | 5/1972 | Wanesky | .......... | 156/249 |
| 4,417,386 A * | 11/1983 | Exner | .......... | 438/118 |
| 5,354,969 A * | 10/1994 | Akiyama et al. | .......... | 219/541 |
| 5,548,091 A * | 8/1996 | DiStefano et al. | .......... | 174/260 |
| 5,684,309 A | 11/1997 | McIntosh et al. | | |
| 5,789,278 A * | 8/1998 | Akram et al. | .......... | 438/118 |
| 5,804,882 A * | 9/1998 | Tsukagoshi et al. | .......... | 257/783 |
| 5,831,277 A | 11/1998 | Razeghi | | |
| 5,861,678 A | 1/1999 | Schrock | | |
| 6,002,180 A * | 12/1999 | Akram et al. | .......... | 257/783 |
| 6,107,118 A | 8/2000 | Aschenbrenner et al. | | |
| 6,111,272 A | 8/2000 | Heinen | | |
| 6,172,382 B1 | 1/2001 | Nagahama et al. | | |

(Continued)

FOREIGN PATENT DOCUMENTS

DE 195 29 490 2/1997

(Continued)

OTHER PUBLICATIONS

T. Takahashi, "Benzocyclotbutene Resin for Thin Film Electronic Applications", Proc. 3rd Japan International SAMPE Symposium, pp. 826-833, Dec. 1993.

(Continued)

*Primary Examiner* — Allan R Wilson
(74) *Attorney, Agent, or Firm* — Cozen O'Connor

(57) ABSTRACT

A device comprising a first component (5) having a first surface (6), a second component (8) having a second surface (9) and a connection layer (7) between the first surface (6) of the first component (5) and the second surface (9) of the second component (8), wherein the connection layer (7) comprises an electrically insulating adhesive and there is an electrically conductive contact between the first surface (6) of the first component (5) and the second surface (9) of the second component (8).

36 Claims, 4 Drawing Sheets

U.S. PATENT DOCUMENTS

| | | |
|---|---|---|
| 6,426,565 B1 | 7/2002 | Bhatt et al. |
| 6,849,881 B1 | 2/2005 | Harle et al. |
| 6,969,917 B2 * | 11/2005 | Hacke et al. .................. 257/785 |
| 7,390,974 B2 * | 6/2008 | Shirai et al. .................... 174/263 |
| 2002/0017652 A1 | 2/2002 | Illek et al. |
| 2002/0053735 A1 * | 5/2002 | Neuhaus et al. .............. 257/728 |
| 2002/0121706 A1 | 9/2002 | Tatsuta et al. |
| 2004/0157407 A1 * | 8/2004 | Tong et al. .................... 438/455 |
| 2005/0285152 A1 | 12/2005 | Hedler et al. |

FOREIGN PATENT DOCUMENTS

| | | |
|---|---|---|
| DE | 101 63 799 | 7/2002 |
| DE | 103 19 782 | 11/2004 |
| DE | 10 2004 030 813 | 1/2006 |
| EP | 0 905 797 | 8/1998 |
| EP | 1 143 519 | 10/2001 |
| JP | 60 262430 | 12/1985 |
| WO | WO 01/39282 | 5/2001 |
| WO | WO 02/07209 | 1/2002 |
| WO | WO 02/13281 | 2/2002 |

OTHER PUBLICATIONS

I. Schnitzer et al., "30% external quantum efficiency from surface textured, thin-film light-emitting diodes", Appl. Phys. Lett. 63, No. 18, pp. 2174-2176, Oct. 1993.

* cited by examiner

ELECTRICALLY CONDUCTING CONNECTION WITH INSULATING CONNECTION MEDIUM

RELATED APPLICATIONS

This is a U.S. national stage under 35 USC §371 of application No. PCT/DE2007/000897, filed on May 16, 2007.

This application claims the priority of German application nos. 10 2006 023 683.1 filed May 19, 2006 and DE 10 2006 028 692.8 filed Jun. 22, 2006, the entire content of both of which is hereby incorporated by reference.

FIELD OF THE INVENTION

The present invention relates to a device comprising a first component having a first surface, a second component having a second surface, and a connection layer between the first surface of the first component and the second surface of the second component, and to a method for producing such a device.

BACKGROUND OF THE INVENTION

In order to connect two components mechanically, electrically and/or thermally to one another, it is possible to employ for example methods using a connection layer, for instance composed of a solder or an adhesive. As described in U.S. Pat. No. 6,111,272, for example, generally an electrically conductive adhesive or a metallic solder is used if an electrically conductive connection is sought, while an electrically insulating adhesive is used for electrically insulating connections. The use of solder is not always possible, however, owing to the relatively high processing temperatures. Furthermore, the use of electrically conductive adhesive is generally costly owing to the fillers by comparison with electrically insulating adhesives.

SUMMARY OF THE INVENTION

One object of the present invention, therefore, is to specify a device comprising an electrically insulating connection layer between two components, wherein an electrically conductive connection is present between the two components. A further object of the present invention is to specify a method for producing such a connection.

In accordance with one embodiment of the invention, a device has a first component having a first surface and a second component having a second surface, wherein at least one of the first and second surfaces has topographic surface structures. The first surface of the first component is connected to the second surface of the second component via an electrically insulating connection layer. There is an electrically conductive contact between the first surface of the first component and the second surface of the second component via the topographic surface structures.

It should be pointed out here that the term "component" is taken to mean not only finished components such as, for example, light-emitting diodes (LEDs) or laser diodes but also substrates or epitaxial layer sequences, such that the first component and the second component connected by the connection layer form a superordinate third component or are part of such a third component.

Thereby, a surface having a topographic surface structure can have a microscopic and/or a macroscopic height profile. In this case, a height profile can extend regularly or irregularly in one or in two directions parallel to the surface over the entire surface or over one or a plurality of partial regions of the surface.

Furthermore, it can be possible for both the first and the second surfaces to have topographic surface structures. In this case, the topographic surface structures can be identical, similar or different at least in one partial region.

In one embodiment of the device, the topographic surface structures are caused by the roughness of the first and/or second surface. This can mean in particular for example that topographic surface structures which the first surface has are different from topographic surface structures which the second surface has, for example, owing to different roughnesses of the first and second surfaces. Preferably, the topographic surface structures of the first surface and the topographic surface structures of the second surface can be identical or similar. This can mean in particular that the roughnesses and peak-to-valley heights of the first and second surfaces are identical or at least similar.

In one embodiment of the device, a significantly thinner connection layer between the two surfaces of the components can advantageously be obtained by means of the electrically insulating connection layer than by means of an electrically conductive connection layer. In particular, this can be possible if the electrically insulating connection layer has an electrically insulating adhesive. This can mean, furthermore, that the electrically insulating connection layer consists of an electrically insulating adhesive or a mixture of electrically insulating adhesives or a mixture of an electrically insulating adhesive with further electrically insulating additives. An electrically insulating adhesive or a mixture of electrically insulating adhesives or a mixture of an electrically insulating adhesive with further electrically insulating additives can be advantageous in comparison with the use of an electrically conductive adhesive for example by virtue of the fact that the electrically insulating adhesive has, for example, no electrically conductive fillers. Owing to the fillers in electrically conductive adhesives, adhesive thicknesses in the range of a few 10 μm are necessary when electrically conductive adhesives are used. By virtue of a very thin connection layer, by contrast, such as is possible for example with an electrically insulating adhesive, it can be possible that the thermal resistance of the connection layer is advantageously reduced by comparison with a connection layer having a larger thickness. Thus, by way of example, electrically insulating connection layers which have electrically insulating adhesives, for example, with thicknesses of 100 nm can contribute to the heat transfer resistance in the case of a planar, whole-area linking and thermal loading of less than 1 K/W. Consequently, it is possible to ensure a good thermal coupling between the first and the second component. In particular, an electrically insulating adhesive can have a thermal conductivity within the range of 0.2 to 0.4 W/mK, in particular of 0.293 W/mK at 24° C., 0.310 W/mK at 45° C. and 0.324 W/mK at 66° C.

In a further embodiment of the device, the electrically insulating connection layer has an electrically insulating adhesive, which can mean in particular that the connection layer has no electrically conductive fillers. In comparison with the electrical contact-connection for example of a semiconductor chip by means of electrically conductive adhesives comprising fillers, it can be possible, therefore, that when using an electrically insulating connection layer without electrically conductive fillers, it is not necessary to take any precaution against a possible migration of the fillers or the constituents thereof. This can be advantageous insofar as, in particular when using fillers comprising silver, the functionality of the semiconductor chip can be restricted by the migration of the silver into the functional layers of the semiconductor chip. Furthermore, the use of an electrically insulating connection layer without electrically conductive fillers can be advantageous since for example gold-filled electrically conductive adhesive can increase the process costs. In addition, the customary electrically conductive adhesives are often not compatible with process chemicals such as are used e.g. in thin-film LED production.

By comparison with the use of solders, the use of electrically insulating connection layers having electrically insulating adhesive, for example, can in particular afford the advantage that electrically insulating connection layers can be processed at significantly lower temperatures in comparison with soldering processes. Thus, solder connections often require process temperatures of more than 200° C. for producing a metallurgical connection, which are not necessarily compatible with the requirements of the components to be connected. In addition, it can be possible that an electrically insulating connection layer having an electrically insulating adhesive, for example, does not necessitate any additional outlay with regard to the separation and for protection of functional layers for example by diffusion barriers, as is occasionally necessary in the case of soldering connections.

The first component or the second component or both can be for example a substrate, a wafer, a glass carrier, a heat sink, an epitaxial layer sequence, a semiconductor chip such as a light-emitting diode chip or a laser diode chip or else an optoelectronic component such as an organic light-emitting diode (LED) or a semiconductor-based light-emitting diode. The lateral extent of the connection layer can therefore range from the size of wafers to the size of chip contacts and smaller.

In particular, an epitaxial layer sequence having an active zone in which electromagnetic radiation is generated during operation can be used as the first component, and a carrier such as a glass substrate or a wafer can be used as the second component. The connection of these two components to one another is expedient for example during the production of a thin-film semiconductor chip.

Thin-film semiconductor chips are distinguished in particular by at least one of the following characteristic features:
  a reflective layer is applied or formed at a first main area—facing toward a carrier—of a radiation-generating epitaxial layer sequence, said reflective layer reflecting at least part of the electromagnetic radiation generated in the epitaxial layer sequence back into the latter;
  the epitaxial layer sequence has a thickness in the region of 20 µm or less, in particular in the region of 10 µm; and
  the epitaxial layer sequence contains at least one semiconductor layer having at least one area having an intermixing structure that ideally leads to an approximately ergodic distribution of the radiation in the epitaxial layer sequence, that is to say that it has an as far as possible ergodically stochastic scattering behavior.

A basic principle of a thin-film light-emitting diode chip is described for example in I. Schnitzer et al., "30% external quantum efficiency from surface-textured, thin-film light-emitting diodes", Appl. Phys. Lett. 63 (16), Oct. 18, 1993, 2174-2176, the disclosure content of which in this respect is hereby incorporated by reference.

In the case of a thin-film semiconductor chip, the growth substrate of the radiation-generating epitaxial layer sequence generally can be removed or thinned and the epitaxial layer sequence can be transferred to another carrier. Since the connection between carrier and epitaxial layer sequence should be electrically conductive, the connection proposed in the present case in particular can be suitable for a thin-film semiconductor chip in order to be able to make contact with the thin-film semiconductor chip via the carrier. Furthermore, this can result in the advantage that an electrically insulating connection layer can be thin enough such that it can have a low thermal resistance in order to be able to effectively dissipate from the epitaxial layer sequence the heat that can arise in the latter during operation. In particular, it can be the case that with an electrically nonconductive connection between the carrier and the epitaxial layer sequence, a possibility of contact-connection from that side of the epitaxial layer sequence which is remote from the carrier is necessary, which would result, however, in an additional consumption of epitaxial area and a lower economic liability associated with this.

Furthermore, the first component can comprise a semiconductor layer sequence, for instance an epitaxial layer sequence, which can have at least two electrical contact areas on one side. The second component can be a carrier, for example a substrate or a leadframe, which can likewise have at least two electrical contact areas. The in each case at least two electrical contact areas of the first and of the second component, respectively, can here have the same or different electrical polarities. By way of example, the first component can be a patterned epitaxial layer sequence for a thin-film semiconductor chip described above, or a semiconductor chip for so-called flip-chip mounting which can be electrically connected to a second component on one side by means of two electrical contact areas having different electrical polarities.

Furthermore, in accordance with the connection proposed here, it is also possible for optoelectronic semiconductor chips such as light-emitting diode chips or laser diode chips to be fixed on a heat sink or a component housing.

In one preferred embodiment, the first surface or the second surface has depressions. In this case, the depressions can be present only on the first surface of the first component or only on the second surface of the second component or on both surfaces to be connected.

In a further embodiment, the first surface of the first component and/or the second surface of the second component have a joining region, within which electrically insulating adhesive can be fitted, which can form the electrically conductive connection layer. In this case, the depressions in the first and/or second surface are preferably arranged around the respective joining region. Preferably, the depressions can serve as collecting reservoirs for the adhesive. As a result it may be possible that excessively applied adhesive displaced from the joining region can flow away into the collecting reservoirs and remain there. In this case, the depressions furthermore can be arranged such that they are spaced apart regularly or irregularly.

In one preferred embodiment, the depressions or receiving reservoirs have a uniform arrangement. A uniform or regular arrangement can be advantageous, for example, since it can be possible that the depressions can be produced with the aid of photo masks customary in the process for producing epitaxial layer sequences and since it can be possible that a reduction of the epitaxial area can be avoided by means of a uniform or regular arrangement.

Advantageously, at least one of the surfaces can have a patterned surface. The patterning can in this case be provided, for example, by a microprism patterning or microreflector patterning. In this case, it is possible to form depressions or collecting reservoirs on the basis of microprisms or microreflectors, which can be produced by etching, for example.

Depressions or collecting reservoirs can be embodied for example as mesa trenches or as parts of mesa trenches which can cut through for example an entire epitaxial layer sequence or a part thereof. In this case, the depth of the depressions can correspond to the thickness of the epitaxial layer sequence or be smaller than that. The depressions can furthermore have a width which can be given by the width of the mesa trenches, which, for example, can in turn be predetermined by later processing steps such as singulation, for instance. In this case, it can be advantageous if the depressions have a volume that is large enough to be able to receive all of the displaced adhesive. On the other hand, the volume of the depressions or collecting reservoirs and the connection layer thickness sought can provide a condition for the adhesive layer to be maximally applied. By way of example, it can be advantageous if the depressions or collecting reservoirs are formed by mesa trenches which have a spacing of approximately 1000 μm and a trench width of approximately 40 μm and the depth of which corresponds for example to the thickness of the epitaxial layer sequence of approximately 7 μm. As a result, a thickness of approximately 0.5 μm can prove to be advantageous for an adhesive layer for application.

In a further embodiment, depressions or collecting reservoirs can be provided by those depressions which are provided by the roughness of a surface or of a region of a surface.

In a further preferred embodiment, the average thickness of the connection layer is of the order of magnitude of the topographic surface structures of the first and/or the second surface. This can mean in particular that the average thickness of the connection layer is of the order of magnitude of the roughness or peak-to-valley height of the first surface and/or of the second surface.

Roughness can be taken to denote the rms value of the height variations of a surface, said value being defined as the root of the mean square distance of a height profile of a surface from a mean height of the surface. The height profile of the surface can be determined by means of an atomic force microscope, for example, by recording height profiles within one or more excerpts of the surface. From the height profile of the surface that is obtained for example by means of atomic force microscopy, sensing stylus profilometry or white light interferometry, it is possible to determine a mean height representing the arithmetic mean of the height profile. With the aid of the mean height and the height profile determined, the rms value can be determined as a value of the roughness of the surface.

The thickness of the connection layer is defined as the distance between the mean height of the first surface and the mean height of the second surface.

Thereby, the roughness of a surface or of a region of a surface can correspond to the natural roughness that results during deposition of metal layers, for instance electrical metal-semiconductor contact layers or metallic reflective layers.

The roughness of a surface or of a region of a surface can be increased, for example by methods for instance such as by photolithographic patterning or sandblasting. Furthermore, an increased roughness can be achieved through the choice of suitable deposition conditions such as, for instance, a slow vapor deposition rate and/or high substrate temperatures.

A sufficiently thin connection layer can thus ensure an electrically conductive contact between the surfaces of the components in particular by virtue of the fact that for example elevated regions of the topographic surface structures of the first surface are in direct contact with the second surface and/or vice versa. In particular, elevated regions of the topographic surface structures of the first surface can be in direct contact with elevated regions of the topographic surface structures of the second surface. If the topographic surface structures of the first and/or second surface are provided by the roughness of the first and/or second surface, then the elevated regions of the topographic surface structures can comprise or in particular be the roughness peaks of the first surface and/or the roughness peaks of the second surface, and it can furthermore be the case that roughness peaks of the first surface together with roughness peaks of the second surface are in direct contact with one another.

In a particularly preferred embodiment, the roughness of the first surface and/or of the second surface at least within the joining region is at least a few nanometers.

In a further embodiment, the first surface and the second surface are embodied such that they are at least partly electrically conductive. In particular, preferably at least one part of the joining region can be embodied in electrically conductive fashion. Furthermore, it is in particular also possible for at least partial regions of the topographic surface structures to be embodied in electrically conductive fashion.

An electrically conductively embodied first surface and/or second surface are/is metallic, for example. The first and/or second surface, in order for them/it to be embodied in electrically conductive fashion, can however, also comprise or consist of a transparent conductive oxide (TCO).

In a further embodiment, the electrically insulating adhesive that forms the connection layer is solvent-resistant to solvents such as, for example, N-methyl-pyrrolidone (NMP) for example 1-methyl-2-pyrrolidinione, acetone, isopropanol, ethanol and/or methanol. Furthermore, an alkali and/or acid resistance toward potassium hydroxide (KOH), sodium hydroxide (NaOH) and/or phosphoric acid can be advantageous.

Furthermore, the electrically insulating adhesive can preferably be vacuum-suitable with regard to a typical process vacuum of between 0.1 millibar and a few hundred millibars, preferably approximately 100 millibars, and/or temperature-stable at temperatures of above 200° C. Such features can generally be advantageous with regard to the requirements during the subsequent process steps and/or the later use of the components. In particular, the connection technique to be employed should be compatible with the customary process steps and chemicals employed in the production chain of the device. In addition, the connection layer should not give rise to any disadvantageous influences on the functioning of the device or the individual components. In particular, it can be advantageous if no disadvantageous effects are brought about by outgassing of solvents, plasticizers or other components.

In a further embodiment, the electrically insulating adhesive is UV-curable. This can be advantageous if the connection layer is optically accessible from at least one side, thus, for example, if a component is transparent, such that the connection layer can be illuminated with UV light from the side of the transparent component.

In a particularly preferred embodiment, the electrically insulating adhesive comprises bisbenzocyclobutene (BCB) or consists of BCB. Processing properties of BCB are described in the document T. Takahashi, "Benzocyclotbutene Resin for Thin Film Electronic Applications", Proc. 3rd Japan International SAMPE Symposium (1993), pp. 826-833, the disclosure content of which in this regard is incorporated by reference. BCB affords the advantage that it cures without producing byproducts such as water, for example, and therefore has only very little shrinkage.

A method for producing an electrically conductive connection between a first component having a first surface and a second component having a second surface, wherein at least one of the first and second surfaces has topographic surface structures, in one embodiment comprises the following steps:

applying an electrically insulating connection layer to the first and/or second surface, positioning the first surface and the second surface with respect to one another, and applying a force to the first component and/or the second component until an electrically conductive contact arises between the first and second surfaces via the topographic surface structures.

In one embodiment of the method the first surface and the second surface have topographic structures.

In a further embodiment of the method, topographic structures are produced by methods such as, for example, etching or grinding.

In a further embodiment of the method, the production of the depressions on at least one of the first and second surfaces to be connected is performed by eroding patterning methods such as, for example, etching or grinding and/or by deforming patterning methods, such as embossing, for example. In this case, different depressions can be produced on one component or on both components by different methods.

In a further embodiment of the method, the electrically insulating connection layer, for instance an electrically insulating adhesive, is applied in patterned fashion. This can be done, for example, by printing methods such as, for instance, inkjet printing or screen printing. In this case, it can be advantageous if a connection layer having a thickness of at least approximately 10 µm is applied by screen printing, and a connection layer of less than approximately 10 µm is applied by inkjet printing. Furthermore, it is possible to utilize stamp methods, for example.

As an alternative, the electrically insulating connection layer, for instance an electrically insulating adhesive, can also be applied in unpatterned fashion, for example by spin-coating or by deposition from the vapor phase. In a further embodiment, the connection layer applied in unpatterned fashion is patterned after application. A patterning can be possible for example by virtue of the fact that at least partial regions of at least one surface or at least of regions thereof have different wetting properties with regard to the connection layer. Different wetting properties can be achieved for instance by a modification of partial regions of at least one surface or at least regions thereof. As an alternative or in addition it can be advantageous if the connection layer can be patterned by light, for example. An exposure can be effected for example by a photo mask. As an alternative, it can also be possible to pattern a connection layer by means of dry- or wet-chemical etching with the aid of a resist mask.

In one expedient embodiment, the connection layer after application has a thickness of between 10 nm and 100 µm. It can furthermore be advantageous if the connection layer after application has a thickness of between 100 nm and 10 µm. It can be particularly advantageous if the connection layer after application has a thickness of between 500 nm and 5 µm. In this case, the thickness of the connection layer after application can depend on the viscosity and/or the patterning of the connection layer and/or on the roughness of the first and/or the second surface.

In a particularly preferred embodiment of the method, the thickness of the connection layer is reduced by means of a force being applied to at least one component or to both components in such a way that, after this application of force, the thickness of the connection layer is of the order of magnitude of the roughness or the peak-to-valley height of the first and/or the second surface. This means, in particular that after application of a force, the thickness of the connection layer has been reduced to an extent such that at least the roughness peaks of the surfaces to be connected touch one another.

In one embodiment of the method, a force within a range of 1 to 40 kN is applied to an area of 20 to 78 $cm^2$.

BRIEF DESCRIPTION OF THE DRAWINGS

Further advantages and advantageous embodiments and developments of the invention will become apparent from the exemplary embodiments described below in conjunction with the figures.

DETAILED DESCRIPTION OF THE DRAWINGS

In the exemplary embodiments and figures, identical or identically acting constituent parts are in each case provided with the same reference symbols. The elements illustrated and their size relationships among one another should not be regarded as true to scale in principle; rather, individual elements such as, for instance layer thicknesses or roughnesses may be illustrated with an exaggerated size for the sake of better representability and/or for the sake of a better understanding.

In the exemplary embodiment in accordance with FIGS. 1A to 1F, within the process sequence for producing a thin-film semiconductor chip, an epitaxial layer sequence, as a first component, is connected to a carrier wafer, as a second component by means of a connection layer.

Figure 1A:
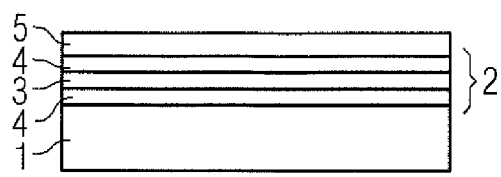
FIGS. 1A to 1F show schematic sectional illustrations of a device in different stages of the method according to the invention.

In order to produce radiation-emitting thin-film semiconductor chips in accordance with FIG. 1A, an epitaxial layer sequence 2 is grown epitaxially on a suitable growth substrate 1, for instance an SiC substrate or a sapphire substrate. The epitaxial layer sequence comprises an active zone 3, in which radiation is generated during operation, and further functional layers 4. For generating radiation, the active zone 3 has for example a pn junction, a double heterostructure, a single quantum well or a multiple quantum well (MQW). In this case, the heterostructure, a single quantum well or a multiple quantum well (MQW). In this case, the designation quantum well structure does not comprise any indication about the dimensionality of the quantization. It therefore encompasses, inter alia, quantum wells, quantum wires and quantum dots and any combination of these structures. Examples of MQW structures are described in the documents WO 01/39282, U.S. Pat. Nos. 5,831,277, 6,172,383 B1 and U.S. Pat. No. 5,684,309, the disclosure content of all of which is hereby incorporated by reference.

Furthermore, a reflective layer 5 is applied to that side of the epitaxial layer sequence 2 which is remote from the growth substrate 1, which reflective layer reflects the radiation which is generated in the active zone 3 which would emerge from the epitaxial layer sequence 2 on the side remote from the growth substrate 1 back into the epitaxial layer sequence 2 again. In this case, the reflective layer 5 comprises Au, Al or Ag or an alloy of these metals and can be present as an individual layer or as a layer sequence comprising layers of other materials. The total thickness of an epitaxial layer sequence 2 of a conventional thin-film semiconductor chip lies within the range of a few micrometers to a few tens of micrometers.

Figure 1B:
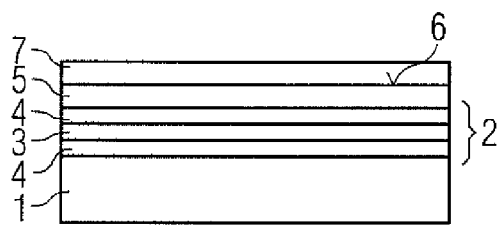

In a further step in accordance with FIG. 1B, a connection layer 7 is applied on the side 6 of the reflective layer 5 remote from the growth subject 1, said side in the present case, serving as the surface of the first component. In this case, a microprism patterning on the side 6 of the reflective layer 5 remote from the growth substrate 1 as described in U.S. 2002/0017652, the disclosure content of which in this respect is hereby incorporated by reference, can advantageously be utilized as prepatterning. More specifically, cutouts are provided in the upper surface of layer 4. These are prism-like indentations having a certain depth. This upper surface is covered by reflective layer 5, which has a thickness smaller than the depth of the cutouts. The upper surface 6 of layer 5 will also show the prism-like structure as layer 5 "follows" the indentations in layer 4. In order to enable contact to be made with the epitaxial layer sequence 2 by means of the reflective layer 5, the reflective layer 5 is preferably formed from an electrically conductive material. Since numerous further process steps are carried out after the connection step, a connection medium is required which, inter alia is solvent-resistant, vacuum-suitable and/or suitable material for the connection layer 7 is for example BCB (bisbenzocyclobutene, which is obtainable, for example, under the brand name Cyclotene 3022-xx from Dow Corning, where "xx" specifies the proportion of prepolymerized BCB monomers in the solvent mesitylene), which can advantageously be spun on like photoresist with well-reproducible thicknesses within the range of 0.5 to ten micrometers and generally adheres well on the surfaces to be connected. The use of Cyclotene 3022-35 or Cyclotene 3022-46 can prove to be advantageous, with which layer thicknesses of approximately 1.0 to approximately 2.3 μm or, respectively, of approximately 2.4 to approximately 5.5 gm can be achieved for example during application.

After application, the BCB film can be patterned, if appropriate, by reactive ion etching using a titanium mask.

As an alternative, the use of Cyclotene 4022-xx, for example where xx=35 or xx=46, which is photo-patternable, can also prove to be advantageous. Layer thicknesses of approximately 2.6 to approximately 5.2 μm or, respectively, of approximately 7.3 to approximately 14.2 μm can be achieved therewith for example during application.

As an alternative, or in addition, the connection layer 7 is also applied to a carrier substrate 8 to be connected to the epitaxial layer sequence 2.

Figure 1C:
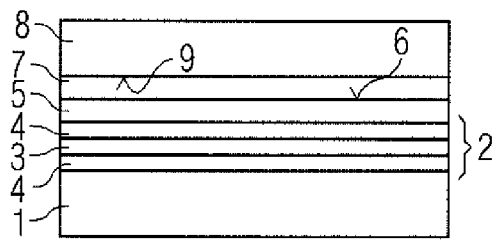

In a further production step in accordance with FIG. 1C, a carrier substrate 8 as second component having a second surface 9 is positioned on the connection layer 7 in a desired position relative to the epitaxial layer sequence 2. Suitable materials for the carrier substrate 8 are electrically conductive such as silicon or metal, for instance, or electrically insulating with an electrically conductive surface. As a result, in the further method steps, it is possible for electrical contact to be made with the epitaxial layer sequence 2 in a simple manner by means of the carrier substrate 8.

Figure 1D:
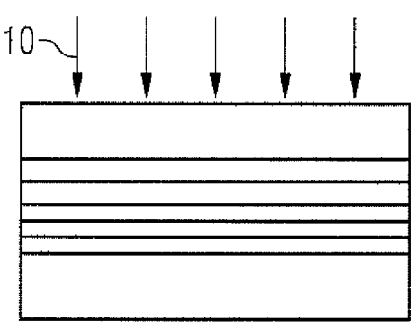

In a further production step in accordance with FIG. 1D, a force 10 is applied essentially perpendicular to the surfaces 6, 9 to be connected of the reflective layer 5 terminating the epitaxial layer sequence 2 and of the carrier substrate 8. As a result, the thickness of the connection layer 7 is reduced to an extent such that, in accordance with the exemplary embodiment in FIG. 2, an electrically conductive contact is produced by the touching of topographic surface structures of the surfaces 6, 9 of the reflective layer 5 terminating the epitaxial layer sequence 2 and of the carrier substrate 8. In this case, the topographic surface structures of the surfaces 6, 9 advantageously can be roughness peaks 20, 21, as shown in the exemplary embodiment in FIG. 2.

Figure 1E:
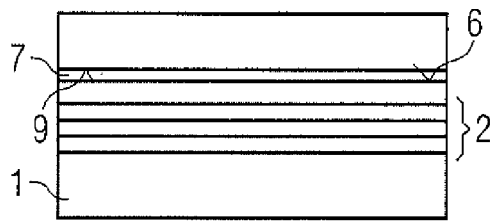

The connection layer 7 thus reduced in thickness in accordance with FIG. 1E is cured under moderate pressure by means of a temperature range that can be chosen freely within wide limits. In this case, a force of approximately 1 to approximately 40 kN on to an area of approximately 20 to approximately 78 cm$^2$ can prove to be suitable.

BCB can be cured for example at temperatures within the range of approximately 150 to approximately 200° C. In this case, curing at a temperature of approximately 150° C. during approximately 12 hours or at a temperature of approximately 200° C. during approximately 0.5 hour can prove particularly advantageous. Furthermore, it can be advantageous to effect pre-curing at a lower temperature, for example approximately 150° C. during approximately 3 minutes, and to effect post-curing at a higher temperature for example approximately 200° C. during approximately 2 minutes.

By virtue of the good process compatibility with regard to mechanical loading capacity and thermal stability of the connection layer 7, the device can be processed further. A good process compatibility can be manifested in particular by virtue of the fact that further process steps are not restricted or adversely influenced by the connection layer. By way of example, the connection layer can make it possible that, by virtue of the absence of outgassing that can be disadvantageous for subsequent process steps in a vacuum, by virtue of the stability toward etching processes and by virtue of the compatibility of the connection layer with temperatures of subsequent process steps, no disadvantageous effect arises on a process for producing for example a semiconductor chip with a connection layer according to the invention.

The growth substrate 1 is thinned or completely removed for example by grinding. In a further method step, a bonding pad 12, for making contact with the epitaxial layer sequence 2, is applied on the surface 11 of the epitaxial layer sequence 2 remote from the carrier substrate 8 (see FIG. 1F). Electrical contact can be made with the semiconductor chip 13 thus obtainable by means of electrical leads that make contact with the carrier substrate 8 and the bonding pad 12. The arrangement of the semiconductor chip 13 on suitable carrier substrates such as leadframes, for instance, is shown in the exemplary embodiments in FIGS. 3 to 5.

The method illustrated can be used for the large-area connection of a four inch epitaxial wafer having the epitaxial layer sequence on a growth substrate, to a carrier wafer.

The method illustrated in FIGS. 1A to 1F and a patterning of the epitaxial layer sequence make it possible for example to produce from a four inch carrier wafer generally approximately 50000 thin-film semiconductor chips, the electrical contact-connection of which by the carrier wafer can be checked and verified for each thin-film semiconductor chip.

It was furthermore possible to ascertain by an estimation that for example a chip produced by a method according to the invention and having a connection layer area of approximately 90000 μm$^2$ had contact location area of at least approximately 700 μm$^2$.

The electrical contact resistances between the carrier wafer and the thin-film semiconductor chips are not increased by comparison with the otherwise conventional soldering connections.

Figure 1F:
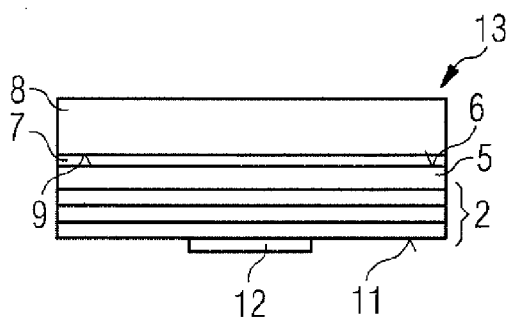

If, unlike in the exemplary embodiment in accordance with FIG. 1F, electrical contact with the semiconductor chip 13 is not made via the carrier substrate 8 on the side 6 of the reflective layer 5 that faces the carrier substrate 8 and also via the bonding pad 12 on the side 11 of the epitaxial layer sequence 2 that is remote from the carrier substrate 8, but rather via patterned electrical contacts on only one side of the epitaxial layer sequence 2, then the patterned electrical contacts are electrically contact-connected to patterned electrical leads for example on a patterned conductor tape by means of a connection layer 7 composed of electrically insulating adhesive. Such a flip-chip mounting as it is called is described in U.S. Pat. No. 6,111,272, the disclosure content of which in this respect is hereby incorporated by reference. In this case, the thin-film semiconductor chip 13 that is to be mounted and to be contact-connected, is placed on to the electrical leads, for example on the conductor tape, wherein suitable depressions 40 (see FIG. 4B) acting as receiving trenches are provided by a patterning of the contacts. Electrically insulating adhesive is used as the connection layer 7 according to the invention, said adhesive affording the advantage that short circuits as a result of fluctuations in the mounting process are fundamentally avoided. It can be possible, for example, that no short circuit of the epitaxial layer sequence is brought about by an excessive amount of applied adhesive that can cover the side areas of a semiconductor chip, that is to say the chip flanks.

Figure 2:
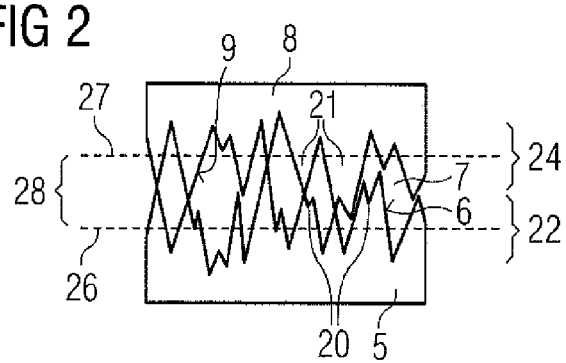
FIG. 2 shows a schematic sectional illustration of a portion from a device in accordance with a first exemplary embodiment.

An excerpt from a device according to the invention is shown in the exemplary embodiment in accordance with FIG. 2. In this case, a first surface 6 of a first component 5 and a second surface 9 of a second component 8 respectively have topographic surface structures 22, 24, which can be determined as a height profile in a measurement, for example by means of atomic force microscopy. A mean height line 26 of the surface 22 and a mean height line 27 of the surface 24 can be specified for the surfaces 6, 9 of the components 5, 8. The distance between the mean height lines 26 and 27 defines the thickness 28 of the connection layer 7. In the exemplary embodiment shown, the surface structures 22, 24 have elevations 20, 21 such as roughness peaks, for instance, between which depressions can be situated. As shown, the elevations can be arranged in irregular fashion, such as, for instance, in the case of an unpatterned roughness profile. As an alternative (not shown), the elevations can also be arranged in regular fashion at least in partial regions.

The first component 5 can be, for example, the epitaxial layer sequence with the reflective layer from the exemplary embodiment 1A, wherein the first surface is that side of the reflective layer which is remote from the epitaxial layer sequence and the second component 8 can be the carrier substrate. As an alternative, the first component 5 can, for example, also be a semiconductor chip 13 such as, for instance, a thin-film semiconductor chip in accordance with one of the subsequent exemplary embodiments, wherein the first surface 6 can be that side of the carrier substrate which is remote from the epitaxial layer sequence, and the second component 8 can be the leadframe of a housing of a surface-mountable component or some other suitable substrate for the semiconductor chip 13 as shown, for example, in the subsequent figures.

By means of the force application 10, the components 5, 8 are brought close to one another until the elevations 20, 21 of the topographic surface structures of the two surfaces 6, 9 touch one another. An electrically conductive contact between the surfaces 6, 9 of the two components 5, 8 is produced via these elevations 20, 21 touching one another. The electrical contact resistance is all the smaller, the more contact points are produced. In this case, the thickness 28 of the connection layer can correspond approximately to the height profile of the topographic surface structures 22, 24, that is to say for example to the roughness of the surfaces 6, 9.

With electrical contact formed between the components 5, 8, the connection layer 7 can be shaped such that the electrically insulating connection medium that forms the connection layer is situated between the elevations 20, 21. A cohesive contact between the components 5, 8 can thereby be ensured.

Figure 3:
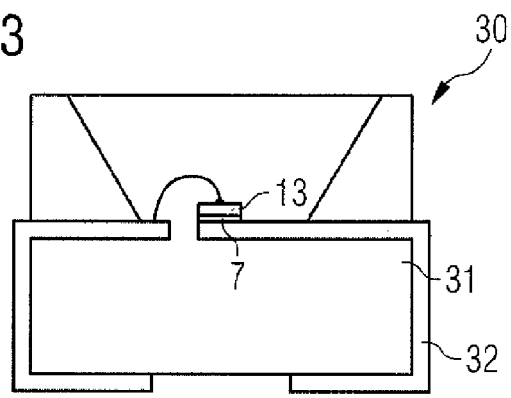
FIG. 3 shows a schematic sectional illustration of a device in accordance with a second exemplary embodiment.

The exemplary embodiment in accordance with FIG. 3 involves the mounting of a semiconductor chip 13, such as, for example, of a thin-film semiconductor chip produced according to the method shown in FIGS. 1A to 1F, said chip being fitted in a surface-mountable component 30. The surface-mountable component 30 has a housing 31, for example, composed of plastic, and a leadframe 32 which enables the surface-mountable component 30 to be mounted and electrically contact-connected for example on a printed circuit board. The semiconductor chip 13 is fitted by one side, in the case of the thin-film semiconductor chip in accordance with the exemplary embodiment 1F by that side of the carrier substrate 8 remote from the epitaxial layer sequence 2, to the leadframe 32 within the housing 31 by means of a connection layer 7 composed of an electrically insulating adhesive and is electrically and thermally coupled to the leadframe 32. In this case, the leadframe 32 serves not only as electrical lead but also as heat sink in order to dissipate the heat arising in the semiconductor chip 13. By using a particularly thin electrically insulating connection layer 7 without the metal filling that is typical of an electrically conductive adhesive, the heat can be dissipated particularly well.

It is advantageously possible to use connection layers composed of BCB as in association with the method in accordance with the exemplary embodiment in FIGS. 1A to 1F with similar processing parameters. The attachment, that is to say for example the placement of a semiconductor chip 13 on to a leadframe 32, can be effected temporally and spatially separately from the curing of the connection layer 7.

Figure 4A:
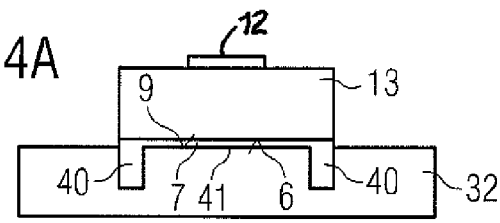
FIG. 4a shows a schematic sectional illustration of a device in accordance with a third exemplary embodiment.

The exemplary embodiment in accordance with FIG. 4A shows a semiconductor chip 13 mounted on a leadframe 32, wherein the leadframe 32, typically a metal tape, has been deformed by embossing in such a way that it has depressions 40 for the electrically insulating adhesive of the connection layer 7. When the semiconductor chip 13 is placed on to the leadframe 32, the press-on force exerts pressure on the adhesive applied as connection layer 7, such that the thickness of the connection layer 7 decreases. In this case, excess adhesive from the connection layer 7 is pressed into the depressions 40 serving as collecting reservoirs for adhesive. In this case, the adhesive thickness in the joining region 41 is reduced to an extent such that an electrically conductive contact arises between the semiconductor chip 13 and the leadframe 32. By virtue of the depressions 40 serving as collecting reservoirs, no displaced excess adhesive arises around the semiconductor chip 13 to be mounted which enables the semiconductor chip 13 to be cleanly contact-connected and mounted on the conductor tape 32.

Figure 4B:
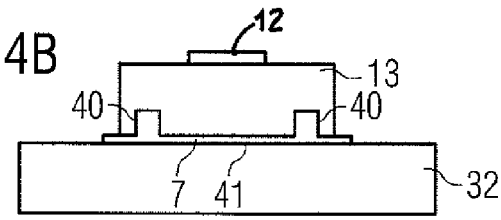
FIG. 4b shows a schematic sectional illustration of a device in accordance with a fourth exemplary embodiment.

In the exemplary embodiment in accordance with FIG. 4B, the semiconductor chip 13 to be mounted in accordance with the exemplary embodiment 1F has depressions 40 serving as collecting reservoirs for adhesive. Said depressions 40 can either be provided by the pattern of that side of the carrier substrate 8 which is remote from the epitaxial layer sequence 2, or be provided by the roughness that arises as a result of the interaction of a grinding process with a crystallographic etching attack.

Contact can be made with the semiconductor chip 13 in accordance with the exemplary embodiment in FIG. 4a or the semiconductor chip 13 in accordance with the exemplary embodiment in FIG. 4B by means of a bonding pad 12, for example on that side of the semiconductor chip which is remote from the leadframe. As an alternative, contact-connection possibilities for semiconductor chip sides can be provided in the case of flip-chip mounting on that side of the semiconductor chip which faces the conductor tape 32 (not shown). The fitting of a bonding pad 12 can then be obviated.

Figure 5:
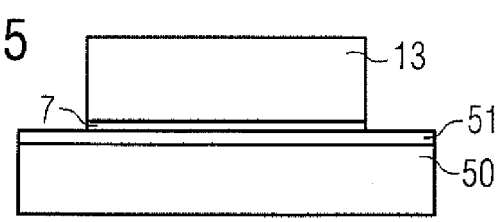
FIG. 5 shows a schematic sectional illustration of a device in accordance with a fifth exemplary embodiment.

In the exemplary embodiment in accordance with FIG. 5, a radiation-emitting semiconductor chip 13 is mounted on a transparent substrate 50 coated with a layer 51 comprising or consisting of a transparent electrically conductive oxide (transparent conductive oxide, "TCO" for short). TCOs are transparent, electrically conductive materials, generally metal oxides, such as, for example, zinc oxide, tin oxide, cadmium oxide, titanium oxide, indium oxide or indium tin oxide (ITO). Alongside binary metal-oxygen compounds such as, for example, ZnO, $SnO_2$, or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped. The semiconductor chip 13 is fixed on the transparent substrate 50 by means of a connection layer 7 composed of an electrically insulating adhesive that can be cured using UV light. In this case, the semiconductor chip 13 which can be produced in accordance with the method of the exemplary embodiment in FIGS. 1A to 1F, is arranged on the substrate in such a way that the carrier substrate 8 faces the substrate 50. Advantageously, the carrier substrate is embodied in transparent fashion and comprises or consists of glass or some other transparent material. As a result radiation emitted by the semiconductor chip 13 can be emitted through the carrier substrate 8 of the semiconductor chip 13, through the connection layer 7, the layer 51 and the transparent substrate 50. After applying the connection layer 7 and positioning the semiconductor chip 13, by applying a force the distance between the semiconductor chip and the layer 51 is reduced to an extent such that, as shown in the exemplary embodiment in FIG. 2, an electrically conductive contact is formed between the semiconductor chip 8 and the layer 51 by the formation of touching points between elevations, for instance roughness peaks, of the topographic surface structures of both components. The electrically insulating adhesive can then be cured for example by using UV light, which can be shone on to the connection layer 7 from the side of the transparent substrate 50. An electrical contact can be effected for example via a contact location comprising one or a plurality of metals or consisting of one or a plurality of metals. Such a contact location can be arranged for instance alongside the semiconductor chip 13, in particular at a suitable distance from the semiconductor chip, on the layer 51 (not shown).

That side of the semiconductor chip which is remote from the substrate 50 and which can have a microprism patterning, for example, can be contact-connected in a similar manner In this case, a further transparent substrate, which comprises or consists of glass, for example, can additionally be arranged on that side of the semiconductor chip 13 which is remote from the substrate 50. The transparent substrate can be coated with an electrically conductive layer comprising a TCO or consisting of a TCO. An electrically conductive connection of the semiconductor chip 13 to the electrically conductive layer likewise can be effected via a connection layer 7. Furthermore, by using a connection layer 7 composed of an electrically insulating material such as, for instance, an electrically insulating adhesive, it can be possible that the regions adjoining the side areas of the semiconductor chip 13 are filled with the connection layer material. A short circuit of the semiconductor chip can be avoided by using an electrically insulating connection layer material.

As an alternative, the substrate 50 can be non-transparent and the substrate 52 can be transparent.

Figure 6A:
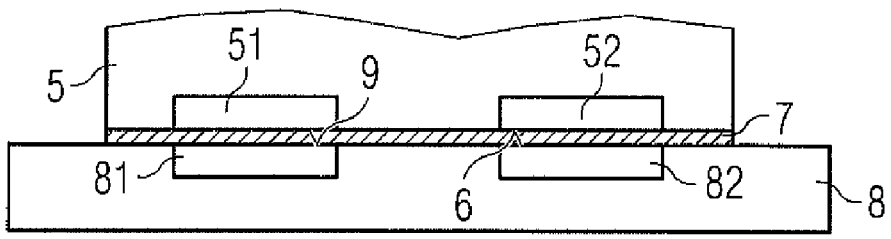
FIGS. 6A to 6E show schematic sectional illustrations of further devices in accordance with further exemplary embodiment embodiments.

FIG. 6A shows an exemplary embodiment having a first component 5 having two electrical contact regions 51, 52. The first component 5, only an excerpt from which is shown, in this case is embodied as an epitaxial layer sequence with which electrical contact can be made via the electrical contact regions 51, 52 on one side. For this purpose, the first component 5 has a continuous first surface 6, which can be electrically connected by the electrical contact regions 51, 52. In the exemplary embodiment shown, the electrical contact regions 51, 52 have different polarities. As an alternative, the electrical contact regions 51, 52 can also have the same electrical polarity such that the electrical connection of the first component can be effected only with regard to one polarity via the patterned contact regions 51, 52 on the first surface 6. As an alternative, the first surface 6 can have more than two electrical contact regions having identical or different polarities.

The first component 5 is arranged on a second component 8 which is a carrier having two electrical contact regions 81, 82. In this case, the carrier can be embodied as a carrier substrate or for instance as a leadframe having a second surface 9, which has electrical contact regions 81, 82 corresponding to the number of electrical contact regions 51, 52 on the first surface 6. As an alternative, an electrical contact region on the second surface 9 can also make contact with more than one electrical contact region on the second surface, or vice versa (not shown).

The first component 5 is fixed and electrically contact-connected on the second component 8 by means of the connection layer 7 arranged between the surfaces 6 and 9. In this case, the connection layer 7 is embodied as in the previous exemplary embodiments and has an electrically insulating adhesive, for instance BCB.

By virtue of the arrangement of the electrical contact regions 51, 52 above the electrical contact regions 81, 82 and a reduction of the thickness of the connection layer 7 to an extent such that the respective roughness peaks of the surfaces 6 and 9 can touch one another, it is possible to achieve an electrical contact between the electrical contact regions 51 and 81, and respectively 52 and 82. For this purpose, the connection layer 7 as in the exemplary embodiment shown, can be continuous and unpatterned and extend as a continuous layer over the electrical contact regions 51, 52, 81, 82. By virtue of the fact that the connection layer is made from an electrically insulating adhesive, a large-area cohesive fixing of the first component 5 to the second component 8 can be achieved without a short circuit arising between the electrical contact regions 51 and 52, and respectively 81 and 82.

Figure 6B:
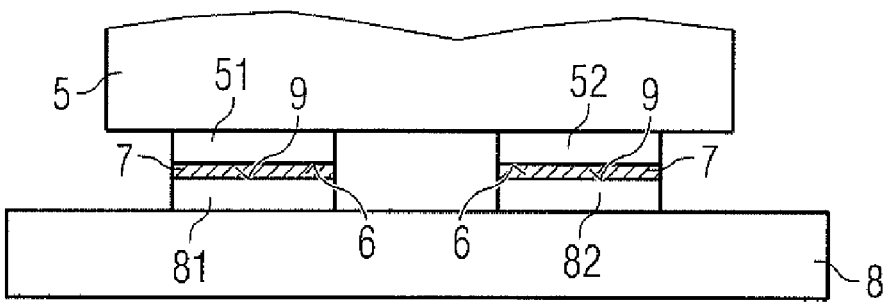

In the exemplary embodiment in FIG. 6B, the first component 5 and the second component 8 respectively have elevated electrical contact regions 51, 52 and 81, 82. The first component 5 can be for instance a semiconductor chip for flip-chip mounting, which is applied on a carrier with leadframe 81, 82 as second component 8. The cohesive fixing and the electrical connection of the first component 5 to the second component 8 are effected via connection layers 7 in the manner described above, which are applied between the respective electrical contact regions 51 and 81, and respectively 52 and 82.

Figure 6C:
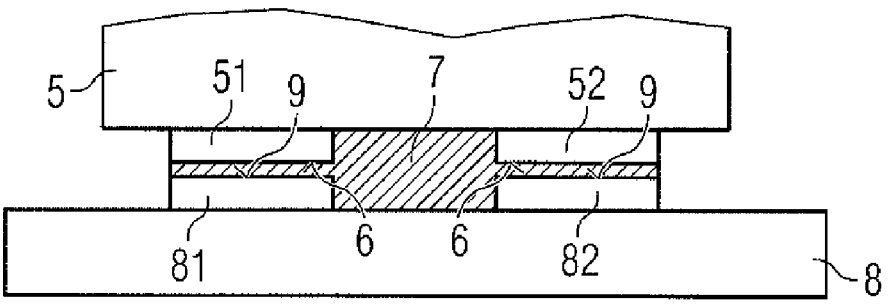

FIG. 6C shows a further exemplary embodiment in which the connection layer 7 is also arranged between the electrical contact regions 51, 52, 81, 82 in order to enable a better cohesive fixing of the first component 5 to the second component 8.

Figure 6D:
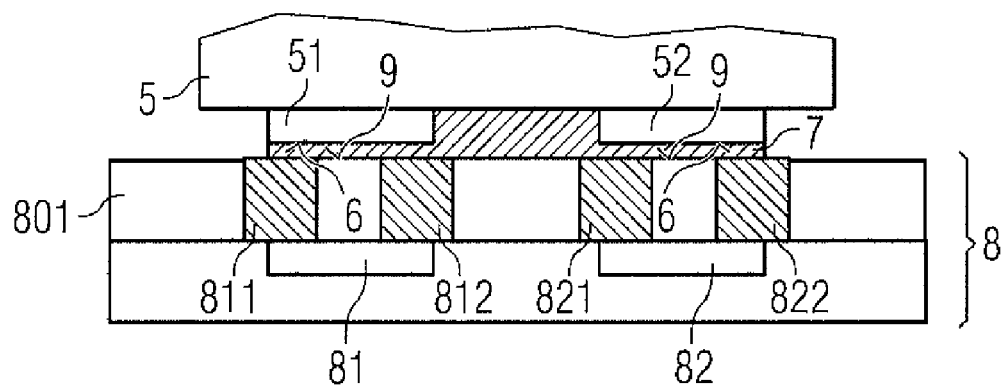

The exemplary embodiment in FIG. 6D shows a second component 8 having an additional layer above the electrical contact regions 81, 82, which comprises an insulating material 801, for instance an oxide such as $SiO_2$, which contains metal fillings 811, 812, 821, 822 that respectively make contact with the electrical contact regions 81 and 82 of the second component 8. Arranged on the layer comprising the insulating material 801 is the first component 5, for instance an epitaxial layer sequence with patterned electrical contact regions 51, 52, which, in the manner described above, are electrically connected by means of a connection layer 7 to the metal fillings 811, 812 and 821, 822, respectively, and thus also to the electrical contact regions 81, 82 of the second component 8. By way of example, the second component 8 can be embodied as a substrate with electrical leads 81, 82 above which is arranged the layer comprising the insulating material 801 and the metal fillings 811, 812, 821, 822. As an alternative, the metal fillings 811, 812, 821, 822 can be surrounded by a layer composed of an insulating material at the interfaces with the material 801, such that the material 801 can also be electrically conductive.

Figure 6E:
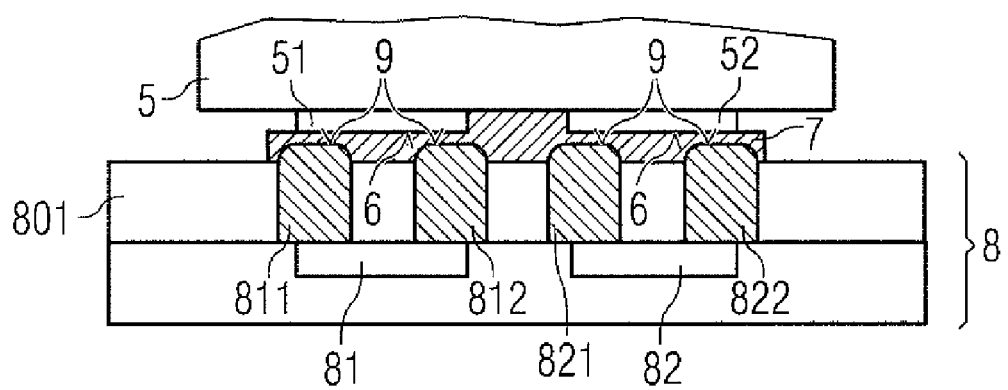

In the exemplary embodiment in FIG. 6E, the metal fillings 811, 812, 821, 822 are embodied in a manner elevated above the material 801, for instance in a mushroom structure. In this case, the electrical contact arises between the second surface 9 of the metal fillings 811, 812, 821, 822 and the first surface 6 of the electrical contact regions 51 and 52 by means of a sufficient reduction of the thickness of the connection layer 7.

By means of a suitable distribution and a suitable dimensioning, in particular, the diameter, of the metal fillings 811, 812, 821, 822 in the exemplary embodiments shown, it is thus possible to achieve an alignment-free contact-connection of the first component 5 to the second component 8. In this case, the number of metal fillings can deviate from the number shown. As an alternative or in addition, the first and/or the second component can have alignment elements such as, for instance guide parts or edges, such that the restrictions to the dimensioning and the arrangement of the metal fillings can be obviated.

The invention is not restricted to the exemplary embodiments by the description on the basis of said exemplary embodiments. Rather, the invention encompasses any new feature and any combination of features, which in particular comprises any combination of features in the patent claims, even if this feature or this combination itself is not explicitly specified in the patent claims or exemplary embodiments.

Then invention claimed is:

1. A device comprising a first component having a first surface and a second component having a second surface, wherein
   at least one of the first and second surfaces has topographic surface structures,
   the first surface of the first component is connected to the second surface of the second component via an electrically insulating connection layer,
   there is an electrically conductive contact between the first surface and the second surface via the topographic surface structures, and
   the topographic surface structures are defined by a roughness of at least one of the first surface and the second surface.

2. The device as claimed in claim 1, wherein both the first surface and the second surface have topographic surface structures.

3. The device as claimed in claim 1, wherein at least one of the first component and the second component is chosen from the group formed by: a substrate, a wafer, a glass carrier, a heat sink, an epitaxial layer sequence and an optoelectronic semiconductor chip.

4. The device as claimed in claim 1, wherein at least one of the first surface of the first component and the second surface of the second component has depressions.

5. The device as claimed in claim 4, wherein the first surface and the second surface have a joining region, in which the connection layer is fitted, and the depressions in the at least one of the first surface and the second surface are arranged around the joining region.

6. The device as claimed in claim 4, wherein the depressions serve as a collecting reservoir for an adhesive of the connection layer.

7. The device as claimed in claim 4, wherein the depressions are arranged such that they are spaced apart regularly.

8. The device as claimed in claim 4, wherein the depressions are arranged such that they are spaced apart irregularly.

9. The device as claimed in claim 1, wherein the average thickness of the connection layer is on an order of magnitude of at least one of the roughness of the first surface and the roughness of the second surface.

10. The device as claimed in claim 1, wherein at least one of the roughness of the first surface and the roughness of the second surface is at least a few nanometers.

11. The device as claimed in claim 1, wherein the first surface and the second surface are embodied such that they are at least partly electrically conductive.

12. The device as claimed in claim 8, wherein at least one of the first surface and the second surface is embodied in at least partly metallic fashion.

13. The device as claimed in claim 1, wherein the connection layer comprises an electrically insulating adhesive.

14. The device as claimed claim 13, wherein the adhesive is at least one of solvent-resistant, vacuum-suitable, temperature-stable and UV-curable.

15. The device as claimed in claim 13, wherein the adhesive comprises bisbenzocyclobutene (BCB).

16. A method for producing an electrically conductive connection between a first component having a first surface and a second component having a second surface, wherein at least one of the first and second surfaces has topographic surface structures, comprising the steps of:
   applying an electrically insulating connection layer to at least one of the first surface and the second surface,
   positioning the first surface and the second surface with respect to one another, and
   applying a force to at least one of the first component and the second component until an electrically conductive contact arises between the first and second surfaces via the topographic surface structures,
   wherein the topographic surface structures are defined by a roughness of at least one of the first surface and the second surface.

17. The method as claimed in claim 16, wherein the first surface and the second surface have topographic structures.

18. The method as claimed in claim 16, wherein the topographic surface structures are produced before the connection layer is applied.

19. The method as claimed in claim 18, wherein the topographic surface structures are produced by at least one of etching, grinding, photolithographic patterning and sandblasting.

20. The method as claimed in claim 16, wherein at least one of the first component and the second component is selected from the group formed by: a substrate, a wafer, a glass carrier, a heat sink, an epitaxial layer sequence and an optoelectronic semiconductor chip.

21. The method as claimed in claim 16, wherein at least one of the first surface of the first component and the second surface of the second component are provided with depressions before the electrically insulating connection layer is applied.

22. The method as claimed in claim 16, wherein the first surface and the second surface have a joining region, in which the connection layer is fitted, wherein depressions in at least one of the first surface and the second surface are arranged around the joining region.

23. The method as claimed in claim 21, wherein the depressions serve as a collecting reservoir for an adhesive of the connection layer.

24. The method as claimed in claim 21, wherein the depressions are arranged such that they are spaced apart regularly.

25. The method as claimed in claim 21, wherein the depressions are arranged such that they are spaced apart irregularly.

26. The method as claimed in claim 21, wherein the depressions are produced by at least one of etching, grinding, embossing, photolithographic patterning and sandblasting.

27. The method as claimed in claim 16, wherein the connection layer is applied in patterned fashion.

28. The method as claimed in claim 27, wherein the patterned application is effected by means of a printing method.

29. The method as claimed in claim 16, wherein the connection layer is applied in unpatterned fashion.

30. The method as claimed in claim 29, wherein the unpatterned application is effected by means of spin-coating or deposition from the vapor phase.

31. The method as claimed in claim 16, wherein the thickness of the connection layer after application comprises a thickness of 100 nm to 10 μm.

32. The method as claimed in claim 31, wherein the thickness of the connection layer is reduced after application by means of a force being applied in such a way that the thickness of the connection layer is on an order of magnitude of at least one of the roughness of the first surface and the roughness of the second surface.

33. The method as claimed in claim 16, wherein an electrically insulating connection layer comprising an adhesive is used.

34. The method as claimed in claim 33, wherein the adhesive is at least one of solvent-resistant, vacuum-suitable, temperature-stable and UV-curable.

35. The method as claimed in claim 33, wherein the adhesive comprises bisbenzocyclobutene (BCB).

36. A device comprising a first component having a first surface and a second component having a second surface, wherein
at least one of the first and second surfaces has topographic surface structures,
the first surface of the first component is connected to the second surface of the second component via an electrically insulating connection layer,
there is an electrically conductive contact between the first surface and the second surface via the topographic surface structures, and
the average thickness of the connection layer is on an order of magnitude of at least one of the roughness of the first surface and the roughness of the second surface.

* * * * *